United States Patent
Zhu et al.

(10) Patent No.: US 9,166,367 B2
(45) Date of Patent: Oct. 20, 2015

(54) OPERATING VERTICAL-CAVITY SURFACE-EMITTING LASERS

(75) Inventors: Zhubiao Zhu, Fort Collins, CO (US); Dacheng Zhou, Fort Collins, CO (US); Daniel A. Berkram, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/386,183

(22) PCT Filed: Apr. 25, 2012

(86) PCT No.: PCT/US2012/034933
§ 371 (c)(1),
(2), (4) Date: Sep. 18, 2014

(87) PCT Pub. No.: WO2013/162540
PCT Pub. Date: Oct. 31, 2013

(65) Prior Publication Data
US 2015/0110142 A1    Apr. 23, 2015

(51) Int. Cl.
*H01S 3/13*   (2006.01)
*H01S 5/06*   (2006.01)
*H01S 5/068*  (2006.01)
*H01S 5/0683* (2006.01)
*H01S 5/183*  (2006.01)
*H01S 3/131*  (2006.01)
*H04B 10/564* (2013.01)
*H01S 5/42*   (2006.01)

(52) U.S. Cl.
CPC ... *H01S 5/06* (2013.01); *H01S 3/13* (2013.01); *H01S 3/131* (2013.01); *H01S 3/1306* (2013.01); *H01S 5/068* (2013.01); *H01S 5/06832* (2013.01); *H01S 5/183* (2013.01); *H01S 5/423* (2013.01); *H04B 10/564* (2013.01)

(58) Field of Classification Search
CPC ..... H01S 5/068; H01S 5/06832; H01S 5/184; H01S 3/13; H01S 3/1306; H01S 3/131
USPC ................. 372/29.021, 29.02, 38.02
See application file for complete search history.

(56) References Cited

U.S. PATENT DOCUMENTS

| | | | |
|---|---|---|---|
| 5,623,355 A * | 4/1997 | Olsen | 398/162 |
| 6,285,481 B1 | 9/2001 | Palmer | |
| 7,058,299 B1 | 6/2006 | Shah et al. | |
| 7,106,678 B2 | 9/2006 | Yano et al. | |
| 7,113,708 B1 | 9/2006 | Creaney et al. | |
| 7,215,883 B1 * | 5/2007 | Lewis | 398/25 |
| 7,613,400 B2 * | 11/2009 | Cheng et al. | 398/186 |
| 7,684,698 B2 | 3/2010 | Stuart et al. | |

(Continued)

OTHER PUBLICATIONS

International Searching Authority, The International Search Report and the Written Opinion, Dec. 26, 2012, 10 Pages.

*Primary Examiner* — Kinam Park
(74) *Attorney, Agent, or Firm* — Brooks, Cameron & Huebsch, PLLC

(57) ABSTRACT

Methods, systems, and computer-readable media are provided for operating a vertical-cavity surface-emitting laser. Operating a vertical-cavity surface-emitting laser can include sending a signal to a driver to decrease an optical power of a vertical cavity surface emitting laser transmitter, and sending a signal to the driver associated with increasing the optical power by a particular amount in response to determining that the optical power is insufficient for reception by a receiver.

14 Claims, 3 Drawing Sheets

(56) References Cited

U.S. PATENT DOCUMENTS

| | | |
|---|---|---|
| 2002/0027690 A1 | 3/2002 | Bartur et al. |
| 2003/0067671 A1 | 4/2003 | Islam et al. |
| 2003/0076569 A1 | 4/2003 | Stevens |
| 2008/0205900 A1 | 8/2008 | Cole et al. |
| 2010/0008662 A1 | 1/2010 | Bradbeer |
| 2012/0076161 A1* | 3/2012 | Chang-Hasnain et al. ... 372/29.02 |

* cited by examiner

OPERATING VERTICAL-CAVITY SURFACE-EMITTING LASERS

BACKGROUND

Optical power in a vertical-cavity surface-emitting laser (VCSEL) can vary as temperature changes. To reduce power consumption and/or increase reliability of VCSELs, power may be controlled automatically, in some instances.

DETAILED DESCRIPTION

Figure 1:
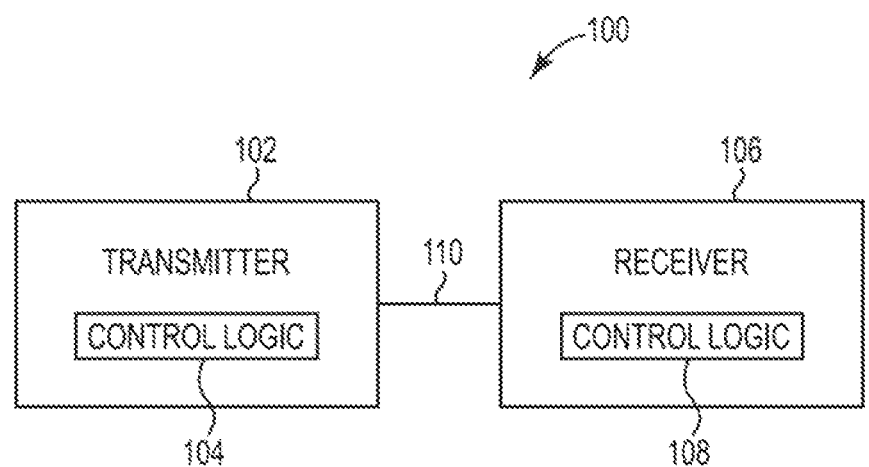
FIG. 1 illustrates a block diagram of an example of system for operating a VCSEL in accordance with the resent disclosure.

Examples of the present disclosure include methods, systems, and/or computer-readable media. An example method for operating a VCSEL can include sending a signal to a driver to decrease an optical power of a vertical cavity surface emitting laser transmitter, and sending a signal to the driver associated with increasing the optical power by a particular amount in response to determining that the optical power is insufficient for reception by a receiver.

Existing techniques for automatically controlling power may include the use of monitoring systems (e.g., external systems) employing a monitoring laser and/or monitoring photodiode. Such systems may additionally include complicated circuits which may further increase costs. Further, such systems may rely on assumptions that various characteristics between the monitoring system and VCSEL system are shared (e.g., operating temperature, mechanical alignment, and/or aging behavior).

In the following detailed description of the present disclosure, reference is made to the accompanying drawings that form a part hereof, and in which is shown by way of illustration now examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

For various semiconductor diodes, junction voltage at a fixed current can decrease as temperature increases. For example, junction voltage in a VCSEL can vary in such a manner (e.g., by −2-mV/° C.). Accordingly, as temperature increases, VCSEL modulated optical power can decrease as threshold current for stimulated emission increases. Such a decrease can be visualized by a slope efficiency curve flattening with increased temperature in a conceptual I-P curve illustrating a relationship between driving current and optical power in a VCSEL. Automatic power control schemes can maintain substantially constant optical power in the face of various changing conditions including, for example, temperature, component age, and/or alignment, among others. Examples of the present disclosure can reduce (e.g., minimize) power usage, increasing VCSEL life and reliability, while still ensuring sufficient optical power to maintain signal reception integrity.

Examples of the present disclosure do not use costly monitoring laser(s) and/or monitoring photodiode(s). Accordingly, examples of the present disclosure can save costs associated with such components, installation of such components, and/or additional complicated circuits that may be associated therewith.

Additionally, examples of the present disclosure can avoid using assumptions of model parameters. For example, monitoring voltage via a monitoring system may require knowledge of various parameters as well as their behaviors over various temperatures and/or over ages. Such knowledge may be costly to gain, and may vary from one VCSEL system to another. Accordingly, examples of the present disclosure can cover various (e.g., all) parts of a VCSEL system, photodiode, and/or path variations (e.g., alignment of transmitter and/or receiver and/or aging).

Additionally, examples of the present disclosure can use data from a VCSEL system itself rather than data from a number of monitoring systems. As a result, examples of the present disclosure can avoid issues associated with differing characteristic between multiple systems. Further, examples of the present disclosure can be integrated into existing link training protocols. Accordingly, examples of the present disclosure can be implemented with reduced (e.g., minimal) changes to hardware (e.g., circuits) resulting in reduced space and/or power, for instance, compared to previous approaches to optical power control.

FIG. 1 illustrates a block diagram of an example of a system 100 for operating a VCSEL in accordance with me present disclosure. As shown in FIG. 1, system 100 includes a transmitter 102 including control logic 104, and a receiver 106, including control logic 108. Though not illustrated in FIG. 1, system 100 can include additional components, such as a number of amplifiers, for instance, among others. As shown in FIG. 1, transmitter 102 and receiver 106 can be connected by channel 110. Channel 110 can be a fiber optical channel, for instance. Though one channel is illustrated, transmitter 102 and receiver 106 can reside in separate sub-networks within an optical network such that they may be in separate interconnected rings and/or in a mesh network that may be coupled together by a number of optical fibers, for instance.

Transmitter 102 can be a VCSEL diode (e.g., semiconductor laser diode with laser transmission perpendicular to its to surface). For example, transmitter 102 can transmit an optical signal (e.g., transmission, light wave and/or pulse) at various power levels (e.g., optical power levels). Various operations of transmitter 102 (e.g., transmission power level control) can be controlled by control logic 104, for instance.

Receiver 106 can be a device and/or module (e.g., a photodetector) configured to receive an optical signal from transmitter 102. For example, receiver 106 can be positioned to receive an optical signal directed toward receiver 106 from transmitter 102. Receiver 106 can be of various types including, for example a positive, intrinsic, and negative photodiode and/or resonant cavity photodetector, among others.

Control logic 104 and/or control logic 108 can be implemented in the form of, for example, hardware logic (e.g., in the form of application specific integrated circuits (ASICs)).

However, examples of the present disclosure are not limited to a particular implementation of control logic 104 and/or control logic 108 unless otherwise indicated. Communication between transmitter 102 and receiver 106 (e.g., between control logic 104 and control logic 108) can include various encoding(s) and/or protocol(s). Further, communication can include communication via a low speed bus (e.g., system control bus, Ethernet, etc.), for instance, among others.

Control logic 104 can decrease an optical power associated with the optical signal. To decrease the optical power, control logic 104 can decrease a current (e.g., output current) of transmitter 102. Such a decrease can occur on a continuous level at a particular rate, for instance. Such a decrease can occur at intervals (e.g., optical power can be decremented by a particular amount over a particular period). Examples of the present disclosure do not limit a decrease of optical power to a particular rate, time, amount, and/or pattern.

Control logic 108 can examine (e.g., read) the received transmission and detect possible errors. The received transmission can be, for example, a predefined pattern known to both the transmitter 102 and the receiver 106 to enable the control logic 108 of the receiver 106 to detect the possible errors. Further, control logic 108 can determine a reception quality of the received optical signal. Control logic 108 can determine that a reception quality of the received signal at receiver 106 exceeds a threshold. The quality of the received signal exceeding a threshold, in accordance with one or more examples of the present disclosure, can include a failure and/or error in the received signal due to low power. Such a failure and/or error can be caused by errors associated with a change (e.g., closure) of an optical eye diagram resulting from an insufficient power level of the optical signal, for instance.

Control logic 108 can send a request to transmitter 102 to increase the optical power responsive to the reception quality exceeding the threshold. Increasing the optical power can include increasing a current (e.g., output) current of transmitter 102. Increasing optical power can include increasing optical power to a particular level (e.g., desired operating power) and/or by a particular portion and/or amount (e.g., 10%). Such a level can be selected based on a determination that receiver 106 will receive a sufficient signal at the particular level, and, at the same time, the power level at the particular level would be adequately low such that system 100 avoids reliability problems associated with increased (e.g., high) power, such as those due to aging and/or stress, for instance. Additionally, such a level can be determined based on an expected rate of failure of the optical signal and/or reception of the optical signal. Such a rate of failure can be measured by a bit error rate (e.g., a bit error rate of the received data pattern with respect to the predefined data pattern). The optical power of the signal from transmitter 102 can be increased such that an expected bit error rate is at a particular level (e.g., $10^{-12}$) and/or falls within a particular range (e.g., $10^{-10}$-$10^{-16}$) and/or signal integrity margin. Additionally, such a level can be determined based on an expected time until failure.

Figure 2:
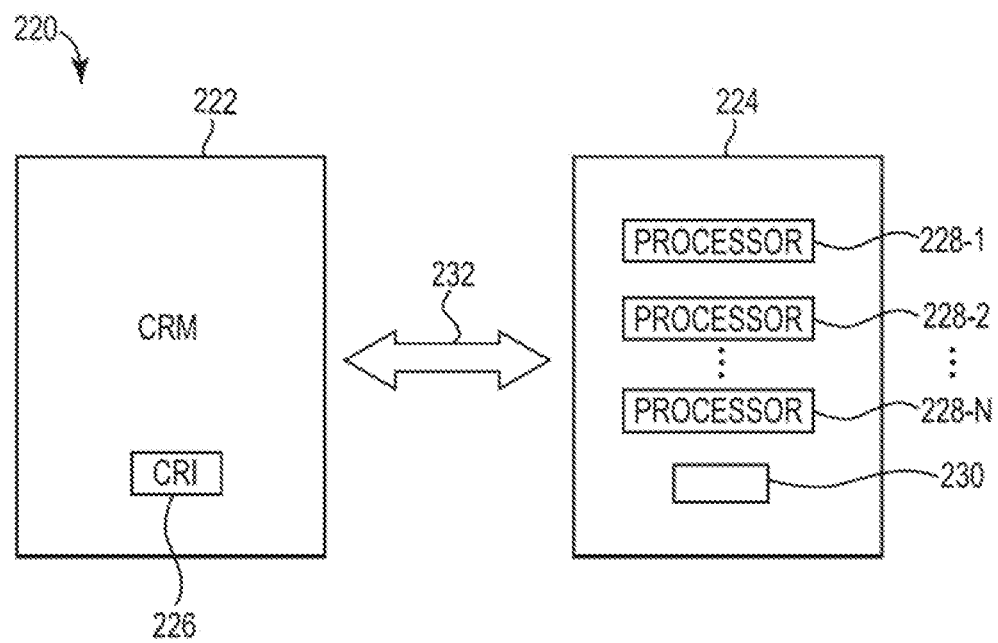
FIG. 2 illustrates a block diagram of an example of a computing system including a computer-readable medium in communication with processing resources for operating a VCSEL in accordance with the present disclosure.

FIG. 2 illustrates a block diagram 220 of an example of a computing system including a computer-readable medium in communication with processing resources for operating a VCSEL in accordance with the present disclosure. Computer-readable medium (CRM) 222 can be in communication with a computing device 224 having processor resources of more or fewer than 228-1, 228-2, . . . , 228-N, that can be in communication with, and/or receive a tangible non-transitory CRM 222 storing a set of computer-readable instructions 226 executable by one or more of the processor resources (e.g. 228-1, 228-2, . . . , 226-N) for operating a VCSEL as described herein. The computing device may include memory resources 230, and the processor resources 228-1, 228-2, . . . , 228-N may be coupled to the memory resources 230.

Processor resources can execute computer-readable instructions 226 for operating a VCSEL that are stored on an internal or external non-transitory CRM 222. A non-transitory CRM (e.g., CRM 222), as used herein, can include volatile and/or non-volatile memory. Volatile memory can include memory that depends upon power to store information, such as various types of dynamic random access memory (DRAM), among others. Non-volatile memory can include memory that does not depend upon power to store information. Examples of non-volatile memory can include solid state media such as flash memory, EEPROM, phase change random access memory (PCRAM), magnetic memory such as a hard disk, tape drives, disk, and/or tape memory, optical discs, digital video discs (DVD), Blu-ray discs (BD), compact discs (CD), and/or a solid state drive (SSD), flash memory, etc., as well as other types of CRM.

Non-transitory CRM 222 can be integral, or communicatively coupled, to a computing device, in either in a wired or wireless manner. For example, non-transitory CRM 222 can be an internal memory, a portable memory, a portable disk, or a memory located internal to another computing resource (e.g., enabling, the computer-readable instructions to be downloaded over the internet).

CRM 222 can be in communication with the processor resources (e.g., 228-1, 228-2, . . . , 228-N) via a communication path 232. The communication path $32 can be local or remote to a machine associated with the processor resources 228-1, 228-2, . . . , 228-N. Examples or a local communication at 232 can include an electronic bus internal to a machine such as a computer where CRM 222 is one of volatile, non-volatile, fixed, and/or removable storage medium in communication with the processor resources (e.g., 228-1, 228-2, . . . , 228-N) via the electronic bus. Examples of such electronic buses can include Industry Standard Architecture (ISA). Peripheral Component interconnect (PCI), Advanced Technology Attachment (ATA), Small Computer System interface (SCSI). Universal Serial BUS (USB), among other types of electronic buses and variants thereof.

Communication path 232 can be such that CRM 222 is remote from the processor resources (e.g., 238-1, 228-2, . . . , 228-N) such as in the example of a network connection between CRM 222 and the processor resources (e.g., 228-1, 228-2, . . . , 228-N). That is, communication path 232 can be a network connection. Examples of such a network connection can include a local area network (LAN), a wide area network (WAN), a personal area network (PAN), and the Internet, among others. In such examples, CRM 222 may be associated with a first computing device and the processor resources (e.g., 228-1, 228-2, . . . , 228-N) may be associated with a second computing device.

Computer-readable instructions 226 can include instructions to send a signal to a driver (e.g., control logic) to decrease an optical power of a VCSEL from a first level to a second level. Such a decrease can be in a manner analogous to that previously discussed in connection with FIG. 1, for instance. Computer-readable instructions 226 can include instructions to increase the optical power from the second level to a third level responsive to a signal received from an optical receiver, wherein the thud level is selected based, at least in part, on an expected failure rate associated with the third level in a manner analogous to that as previously discussed in connection with FIG. 1.

Figure 3:
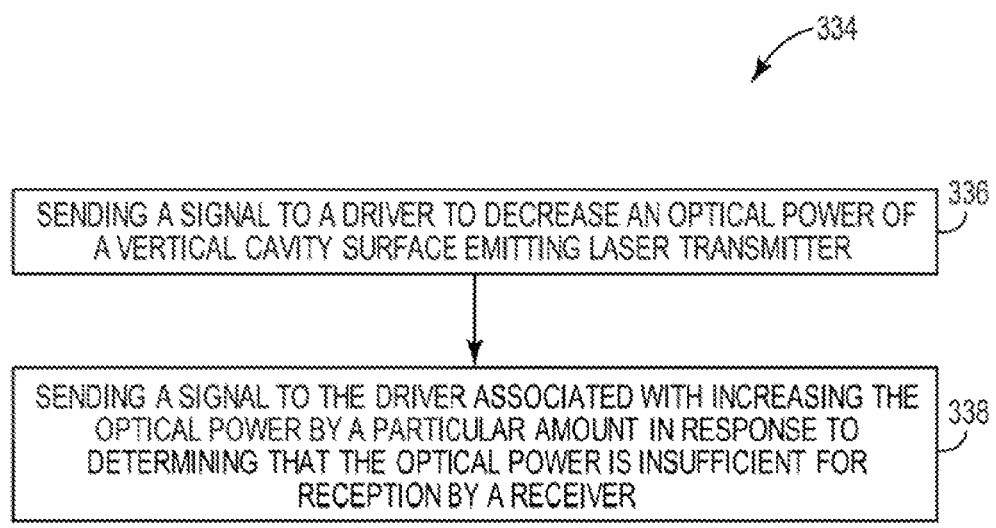
FIG. 3 is a flow chart illustrating an example of a method for operating a VCSEL in accordance with the present disclosure.

FIG. 3 is a flow chart illustrating an example of a method 334 for operating a VCSEL in accordance with tie present disclosure. Method 334 can be performed by a number of hardware devices and/or a number of computing devices executing computer-readable instructions (e.g., the computing system discussed above in connection with FIG. 2).

At block 336, method 334 includes sending a signal to a driver to decrease an optical power of a VCSEL. Optical power can be decreased in various manners such as, for example, those previously discussed in connection with FIG. 1.

At block 338, method 334 includes sending a signal to the driver associated with increasing the optical power by a particular amount in response to determining that the optical power is insufficient for reception by a receiver. Increasing the optical power responsive to a determination of signal insufficiency can be done in a manner analogous to that previously discussed in connection with FIG. 1, for instance.

In accordance with one or more examples of the present disclosure, method 334 can be repeated at various times, intervals, and/or periodically. Additionally, method 334 can be initiated by a user, various device inputs (e.g., sensing devices and/or hardware), and/or processor-executed instructions at various times. For example, if a VCSEL is located in an area (e.g., room) where temperature varies, method 334 can be initiated based on a number of inputs from a temperature sensor, for instance. For example, if the temperature in a room housing a VCSEL system drops, VCSEL junction voltage can increase. Accordingly, optical power of the VCSEL, can increase and such an increase may yield excess (e.g., surplus and/or unnecessary) optical power. A temperature sensor can determine (e.g., measure, detect, and/or acquire) temperature data and can accordingly initiate method 334 responsive to a particular temperature and/or temperature change, for instance.

Additionally, method 334 can be initiated upon installation and/or configuration of a VCSEL system. Installation and/or configuration can include link training, for example, and examples of the present disclosure can be implemented in addition to, or as a portion of, existing link training procedures and/or protocols.

The above specification, examples and data provide a description of the method and applications, and use of the system and method of the present disclosure. Since many examples can be made without departing from the spirit and scope of the system and method of the present disclosure, this specification merely sets forth some of the many possible example configurations and implementations.

Although specific examples have been illustrated and described herein, those of ordinary skill in the art will appreciate that an arrangement calculated to achieve the same results can be substituted for the specific example, shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

What is claimed:

1. A method for operating a vertical-cavity surface-emitting laser, comprising:
    sending a signal to a driver to decrease an optical power of a vertical cavity surface emitting laser transmitter; and
    sending a signal to the driver associated with increasing the optical power by a particular amount in response to determining that the optical power is insufficient for reception by a receiver, wherein the particular amount is selected based, at least in part, on an expected time until a reception failure.

2. The method of claim 1, wherein the method includes determining the failure while the optical power is being decreased.

3. The method of claim 1, wherein the method includes sending the signal to decrease the optical power at a particular interval.

4. The method of claim 1, wherein the method includes sending the signal to decrease the optical power responsive to an input from a sensing device.

5. The method of claim 1, wherein the method includes decrementing the optical power by a particular amount.

6. The method of claim 1, wherein the method includes sending a signal to the driver associated with increasing the optical power by a percentage of the optical power determined to be insufficient for reception by the receiver.

7. A non-transitory computer-readable medium comprising instructions stored thereon executable by a processor to:
    decrease an optical power of a vertical-cavity surface-emitting laser from a first level to a second level; and
    increase the optical power from the second level to a third level responsive to a signal received from an optical receiver, wherein the third level is selected based, at least in part, on a particular expected failure rate associated with the third level and an expected time until a reception failure.

8. The computer-readable medium of claim 7, wherein the instructions include instructions executable to decrease the optical power from the first level to the second level over a particular time period.

9. The computer-readable medium of claim 7, wherein the instructions include instructions executable to decrease the optical power from the first level to the second level at a particular rate.

10. The computer-readable medium of claim 7, wherein the instructions include instructions executable to increase an output current of the vertical-cavity surface-emitting laser.

11. A system for operating a vertical-cavity surface-emitting laser, comprising:
    a vertical-cavity surface-emitting laser transmitter to transmit a transmission; and
    a vertical-cavity surface-emitting laser receiver to receive the transmission, including control logic to:
        compare the received transmission to a predefined data pattern;
        request the transmitter to reduce a transmission power in response to a bit error rate of the received transmission being within a particular range of an expected bit error rate; and
    request the transmitter to increase the transmission power by a particular amount in response to the bit error rate exceeding the particular range, wherein the particular amount is selected based, at least in part, on an expected time until a reception failure.

12. The system of claim 11, wherein the receiver includes control logic to send the request to the transmitter to add the particular amount to the transmission power of the transmitter associated with the transmission that resulted in the bit error rate exceeding the particular range.

13. The system of claim 11, wherein the particular amount comprises a signal integrity margin for the transmitter.

14. The system of claim 11, wherein the receiver includes control logic to determine a desired operating power of the transmitter in response to the bit error rate exceeding the particular range.

\* \* \* \* \*